United States Patent
Domino

(10) Patent No.: US 10,063,216 B2
(45) Date of Patent: Aug. 28, 2018

(54) STEP ATTENUATORS

(71) Applicant: SKYWORKS SOLUTIONS, INC., Woburn, MA (US)

(72) Inventor: William J. Domino, Yorba Linda, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/295,993

(22) Filed: Oct. 17, 2016

(65) Prior Publication Data

US 2017/0033772 A1  Feb. 2, 2017

Related U.S. Application Data

(63) Continuation of application No. 14/632,996, filed on Feb. 26, 2015, now Pat. No. 9,473,194.

(60) Provisional application No. 61/945,773, filed on Feb. 27, 2014.

(51) Int. Cl.
*H04B 1/38* (2015.01)
*H03H 17/00* (2006.01)
*H04B 1/40* (2015.01)
*H03H 7/25* (2006.01)

(52) U.S. Cl.
CPC .......... *H03H 17/0054* (2013.01); *H03H 7/25* (2013.01); *H04B 1/40* (2013.01)

(58) Field of Classification Search
CPC .. H04B 1/40; H04B 3/23; H04B 1/403; H04L 27/2601; H04L 1/0025; H04L 1/0003; H04L 1/0071; H04L 5/0007; H04L 1/0009; H04L 27/0008; H03H 11/24
USPC ........................................ 375/219, 316, 295
See application file for complete search history.

(56) References Cited

U.S. PATENT DOCUMENTS

| | | | |
|---|---|---|---|
| 2014/0266518 A1* | 9/2014 | Wang | H03H 7/25 333/81 R |
| 2015/0137913 A1* | 5/2015 | Costa | H03H 11/245 333/81 R |

* cited by examiner

*Primary Examiner* — Zewdu Kassa
(74) *Attorney, Agent, or Firm* — Chang & Hale LLP

(57) ABSTRACT

In some embodiments, an attenuator can include a first group of attenuation steps with each attenuation step being configured to switchably provide a first attenuation value, and a second group of attenuation steps with each attenuation step being configured to switchably provide a second attenuation value less than the first attenuation value. The attenuator can be capable of providing a total attenuation value from approximately zero to a sum of the attenuation steps of the first group and the second group in increments of the second attenuation value. With such a configuration, a glitch can have a maximum magnitude that is a difference between the first attenuation value and the second attenuation value during a change in the total attenuation value.

20 Claims, 12 Drawing Sheets

Δatt.=13dB

Δatt.=13dB

Δatt.=13dB

Δatt.=13dB

STEP ATTENUATORS

CROSS-REFERENCE TO RELATED APPLICATION(S)

This application is a continuation of U.S. application Ser. No. 14/632,996 filed Feb. 26, 2015, entitled SYSTEMS, DEVICES AND METHODS RELATED TO RADIO-FREQUENCY STEP ATTENUATORS, which claims priority to and the benefit of the filing date of U.S. Provisional Application No. 61/945,773 filed Feb. 27, 2014, entitled SYSTEMS, DEVICES AND METHODS RELATED TO RADIO-FREQUENCY STEP ATTENUATORS, the benefits of the filing dates of which are hereby claimed and the disclosures of which are hereby expressly incorporated by reference herein in their entirety.

BACKGROUND

Field

The present disclosure relates to step attenuators.

Description of the Related Art

In electronic applications such as radio-frequency (RF) applications, it is sometimes desirable to amplify or attenuate a signal such as an RF signal. In the context of amplification, a to-be-transmitted RF signal can be amplified by a power amplifier (PA); and a received RF signal can be amplified by a low-noise amplifier (LNA). In the context of attenuation, one or more attenuators can be implemented along each of the foregoing transmit (Tx) and receive (Rx) paths as needed or desired.

SUMMARY

In accordance with a number of implementations, the present disclosure relates to a step attenuator having an attenuator circuit including stages connected in series between a first node and a second node. The stages include a plurality of first attenuation steps each configured to provide switchable attenuation with a first gain. The stages further include a plurality of second attenuation steps each configured to provide switchable attenuation with a second gain. The step attenuator further includes a controller in communication with the attenuator circuit. The controller is configured to control the switchable attenuation of each of the first attenuation steps and the second attenuation steps.

In some embodiments, the first attenuation steps can include N steps such that the N steps provide attenuation between approximately zero and N times the first gain. The second attenuation steps can include M steps, and the second gain can be selected such that the first gain has a value of (M+1) times the second gain. The attenuator circuit can have an overall attenuation value in a range of approximately zero to a maximum value in steps of the second gain, with the maximum value being a sum of N times the first gain and M times the second gain.

In some embodiments, the attenuator circuit can be susceptible to a glitch during a transition operation from a start attenuation state to a stop attenuation state, with the glitch being a magnitude of a temporary excursion of the overall attenuation value outside the transition range, and the glitch magnitude having a maximum value of a difference between the first gain and the second gain. The quantity N, the quantity M, the first gain, and the second gain can be selected such that the maximum glitch value is less than a maximum glitch value associated with a binary-weighted step attenuator having a similar range of overall attenuation and a similar step size. The maximum glitch value of the step attenuator can be less than half of the maximum glitch value of the binary-weighted step attenuator. The quantity N can be, for example, 7, and the quantity M can be, for example, 3; and the first gain can be 4 dB, and the second gain can be 1 dB, such that the overall attenuation value is in a range of approximately zero to 31 dB. The maximum glitch value of the step attenuator can be less than or equal to a fifth of the maximum glitch value of the binary-weighted step attenuator.

In some embodiments, the sum of the quantities N and M can be less than the total number of attenuation steps in a thermometer-coded step attenuator having a similar range of overall attenuation and a similar step size. The sum of the quantities N and M can be less than half of the total number of attenuation steps in the thermometer-coded step attenuator. The quantity N can be 7, and the quantity M can be 3. The first gain can be 4 dB, and the second gain can be 1 dB, such that the overall attenuation value is in a range of approximately zero to 31 dB. The sum of the quantities N and M can be less than a third of the total number of attenuation steps in the thermometer-coded step attenuator.

In some embodiments, each of the first and second attenuation steps can include a parallel arrangement of a resistance circuit and a switch. The resistance circuit can include a π-type or T-type network of resistors. The resistors can be implemented as thin-film resistors.

In some embodiments, the attenuator circuit can be implemented on a GaAs substrate. The controller can be implemented on a CMOS substrate.

In some implementations, the present disclosure relates to a method for attenuating a radio-frequency (RF) signal. The method includes passing an RF signal through an attenuator circuit including stages connected in series between a first node and a second node. The stages include a plurality of first attenuation steps, with each configured to provide switchable attenuation with a first gain. The stages further include a plurality of second attenuation steps, with each configured to provide switchable attenuation with a second gain. The method further includes controlling the switchable attenuation of each of the first attenuation steps and the second attenuation steps to yield an overall attenuation for the RF signal between the first node and the second node.

In some embodiments, the first attenuation steps can include N steps and the second attenuation steps include M steps. The second gain can be selected such that the first gain has a value of (M+1) times the second gain. The overall attenuation of the attenuator circuit can be in a range of approximately zero to a maximum value in steps of the second gain, with the maximum value being a sum of N times the first gain and M times the second gain. The controlling can include providing one or more sets of switching signals to the stages, with each set of switching signals resulting in a change in the overall attenuation. The one or more sets of switching signals can result in the attenuator circuit being susceptible to a glitch during the change in the overall attenuation, with the glitch being a magnitude of a temporary excursion of the overall attenuation value outside a transition range between a start state and a stop state, and the glitch magnitude having a maximum value of a difference between the first gain and the second gain.

In some embodiments, the controlling can include providing a single set of switching signals to the stages, with the single set of switching signals resulting a likelihood of glitch occurrence in about a third of possible changes in attenuation.

In some embodiments, the controlling can include providing multiple sets of switching signals to the stages in sequence, the multiple sets of switching signals configured to reduce a likelihood of glitch occurrence. The multiple sets of switching signals can be configured to eliminate the likelihood of glitch occurrence except in attenuation changes involving a single first attenuation step and at least one second attenuation step.

In some embodiments, the multiple sets of switching signals can include a first set of switching signals that result in one or more of the first attenuation steps being switched to change the overall attenuation from the start state towards the stop state, a second set of switching signals that result in one or more of the second attenuation steps being switched to change the overall attenuation back towards the start state, and a third set of switching signals that result in one or more of the first attenuation steps being switched to change the overall attenuation towards the stop state, to thereby effectuate the attenuation change without a glitch.

In some embodiments, the multiple sets of switching signals can include a first set of switching signals that result in a first attenuation change from the start state towards the stop state, and a second switching signals that result in a second attenuation change back towards the start state, with the magnitude of the first attenuation change being greater than the magnitude of the second attenuation change.

According to some teachings, the present disclosure relates to a radio-frequency (RF) attenuation module that includes a packaging substrate configured to receive a plurality of components, and an attenuator implemented on the packaging substrate. The attenuator includes an attenuator circuit having stages connected in series between a first node and a second node. The stages include a plurality of first attenuation steps, with each being configured to provide switchable attenuation with a first gain. The stages further include a plurality of second attenuation steps, with each being configured to provide switchable attenuation with a second gain. The attenuator further includes a controller in communication with the attenuator circuit, with the controller being configured to control the switchable attenuation of each of the first attenuation steps and the second attenuation steps.

In some embodiments, the attenuator can be implemented on a first semiconductor die, and the controller can be implemented on a second semiconductor die. The first semiconductor die can be a GaAs die, and the second semiconductor die can be a CMOS die.

In a number of implementations, the present disclosure relates to a radio-frequency (RF) system that includes a transceiver configured to generate an RF signal to be transmitted and process a received RF signal. The RF system further includes an antenna in communication with the transceiver, with the antenna being configured to facilitate transmission and reception of the respective RF signals. The RF system further includes an attenuator implemented to provide attenuation for at least some of the RF signals. The attenuator includes an attenuator circuit having stages connected in series between a first node and a second node. The stages include a plurality of first attenuation steps, with each being configured to provide switchable attenuation with a first gain. The stages further include a plurality of second attenuation steps, with each being configured to provide switchable attenuation with a second gain. The attenuator further includes a controller in communication with the attenuator circuit, with the controller being configured to control the switchable attenuation of each of the first attenuation steps and the second attenuation steps.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
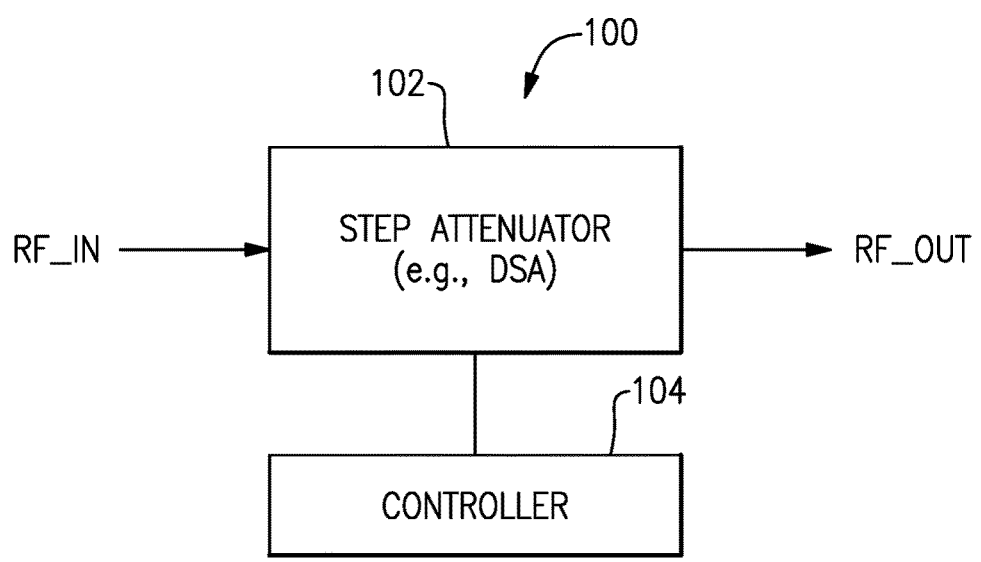
FIG. 1 depicts a step attenuator configured to receive an RF signal and yield an attenuated RF signal.

Disclosed herein are various examples of systems, devices and methods related to step attenuators that can be utilized in, for example, radio-frequency (RF) applications. FIG. 1 schematically depicts a step attenuator configuration 100 having a step attenuator circuit 102 configured to receive an RF signal (e.g., RF_in) and yield an attenuated RF signal (e.g., RF_out). In some embodiments, the step attenuator circuit 102 can be configured to operate as a digital step attenuator (DSA). As described herein, operation of such a step attenuator circuit 102 can be controlled and/or facilitated by a controller 104. Non-limiting examples related to the step attenuator configuration 100 are described herein in greater detail.

Figure 2:
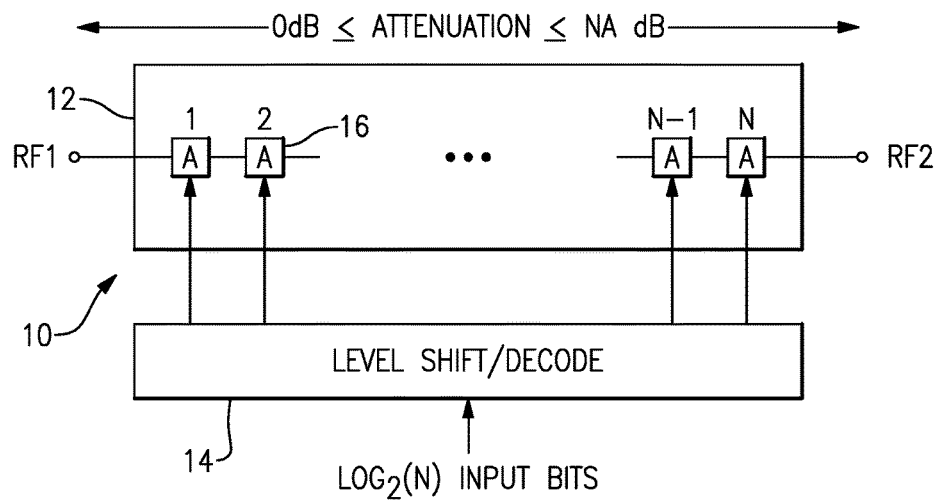
FIG. 2 shows a conventional step attenuator, commonly referred to as a thermometer-coded attenuator, controlled by a controller.

Step attenuators are typically implemented as a plurality of independently-enabled stages. For example, FIG. 2 shows a conventional step attenuator 10 having an attenuator circuit 12 controlled by a controller 14 (e.g., a level shift/decode circuit). The attenuator circuit 12 is depicted as providing an attenuating path between a first node RF1 and a second node RF2. The first node RF1 can be an input node for an RF signal, in which case the second node RF2 can function as an output node. In some embodiments, the attenuator circuit 12 can be operated in reverse, such that the second node RF2 functions as an input node and the first node RF1 functions as an output node.

In the example of FIG. 2, there are N independently-controlled attenuation elements 16, with each attenuation element configured to provide an attenuation of A-dB. Accordingly, the N attenuation elements 16 can provide an overall attenuation having a value between 0 dB and NA-dB in A-dB steps, between the RF1 and RF2 nodes. For example, when all of the N attenuation elements 16 are bypassed in an RF path, the overall attenuation value is approximately 0 dB. In another example, when all of the N attenuation elements 16 are inserted into the RF path, the overall attenuation value is approximately NA-dB.

In the example of FIG. 2, the N attenuation elements 16 are shown to be controlled independently by the level shift/decode circuit 14. For N such elements with each element having binary states, a control signal having $Log_2(N)$ bits can provide sufficient information for the independent control of the N attenuation elements 16.

The example step attenuator 10 of FIG. 2 is commonly referred to as a thermometer-coded attenuator. Because all of the attenuation elements have the same attenuation value, thermometer-coding can benefit from monotonicity. Gain may jitter during a transition between a start state to a stop state; however, the overall attenuation value generally does not go outside a range defined by the start and stop attenuation values.

Figure 3:
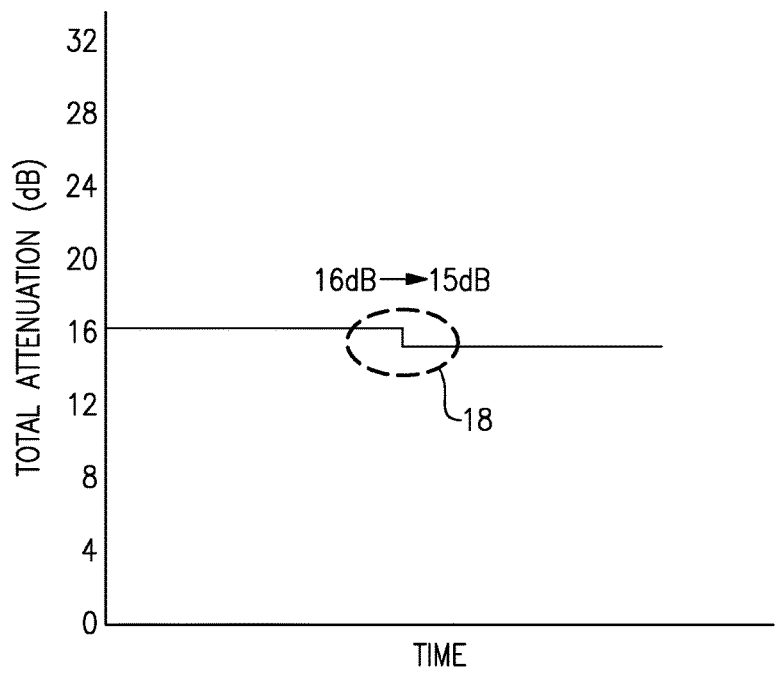
FIG. 3 shows an example attenuation transition that can be implemented in the thermometer-coded attenuator of FIG. 2.

For example, FIG. 3 shows an example transition that can be implemented for the thermometer-coded attenuator 10 of FIG. 2. Suppose that there are 32 independently-controlled elements in the attenuator circuit 12, with each element providing 1 dB attenuation. The example transition in FIG. 3 is a 1 dB reduction in overall attenuation, starting from a 16 dB state to a 15 dB state. There is essentially only one operation that can effectuate such a transition; and that is subtracting a 1 dB element from the RF path.

For an example transition where a decrease of more than 1 dB is desired (e.g., 6 dB reduction), an appropriate number of 1 dB elements (e.g., 6 elements) can be subtracted from the RF path. Similarly, a transition where an increase of one or more dB is desired can be effectuated by adding one or more 1 dB elements into the RF path.

One can see that for the thermometer-coded attenuator 10 of FIG. 2, all feasible transitions within the operating range involve essentially only one type of operation to transition from the start state to the stop state in a monotonic manner. More particularly, a transition where a decrease in overall attenuation is desired involves subtraction of a number of attenuation elements, such that even if the subtraction operations are effectuated over some time period, the intermediate values of overall attenuation decrease monotonically between the start attenuation value and the stop attenuation value. Further, none of the intermediate values ventures outside of the range defined by the start attenuation value and the stop attenuation value. Similarly, a transition where an increase in overall attenuation is desired involves addition of a number of attenuation elements, such that even if the addition operations are effectuated over some time period, the intermediate values of overall attenuation increase monotonically between the start attenuation value and the stop attenuation value. Further, none of the intermediate values ventures outside of the range defined by the start attenuation value and the stop attenuation value.

The foregoing monotonicity feature of the thermometer-coded attenuator 10 of FIG. 2, resulting in the intermediate values remaining within the transition range during an attenuation transition, can be characterized as being glitch-free. For the purpose of description, a glitch can be defined as how much an overall attenuation goes outside a range defined by a start attenuation value and a stop attenuation value during an attenuation transition.

Generally, a glitch is an undesirable property of an attenuator. In such a context, the example thermometer-coded attenuator 10 of FIG. 2 being glitch-free is a desirable property. However, attenuators such as the example of FIG. 2 can have undesirable properties. For example, the overall size of a thermometer-coded attenuator can be problematic. Suppose that the example thermometer-coded attenuator 10 of FIG. 2 is to be implemented to provide attenuation between 0 dB and 32 dB, in 1 dB steps. Such an attenuator can include 32 attenuation elements, with each element having an independent driver channel. In another example, an attenuator with a range of 0 dB to 32 dB with 0.5 dB steps can include 64 attenuation elements, with each element having an independent driver channel.

Figure 4:
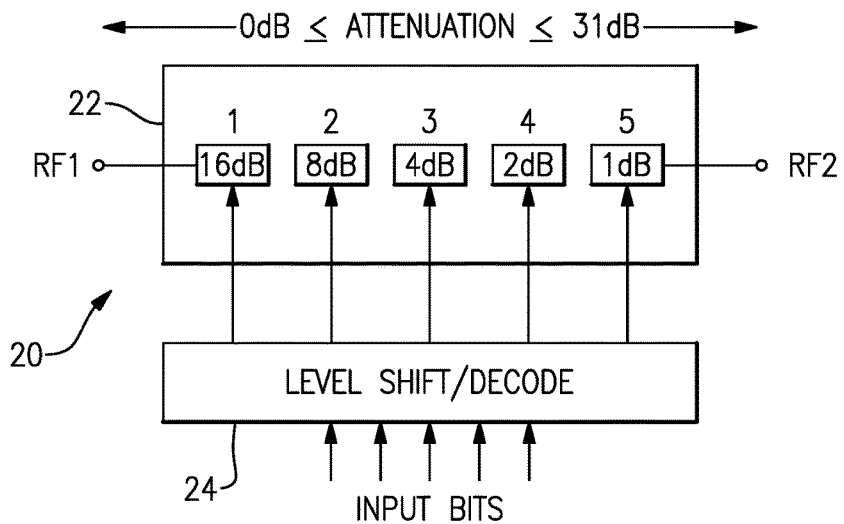
FIG. 4 shows another conventional attenuator having a plurality of cascading N binary-weighted stages.

FIG. 4 shows another example of a conventional attenuator 20 having an attenuator circuit 22 and a level shift/decode circuit 24. The attenuator circuit 22 is shown to include a plurality of cascading N binary-weighted independently-enabled stages. Such attenuation stages can be added or subtracted from an RF path between a first node RF1 and a second node RF2. When the first node RF1 functions as an input, the second node RF2 can function as an output. When operated in reverse, the second node RF2 can function as an input, and the first node RF1 can function as an output.

By applying a binary control word with N bits, $2^N$ attenuation states can be achieved. For example, with N=5 stages of attenuations 16 dB, 8 dB, 4 dB, 2 dB and 1 dB, $2^5=32$ attenuation states can be achieved, spanning a range of 0 dB to 31 dB, inclusive, in 1 dB steps. As shown, a control word having 5 bits can allow implementation of such 32 attenuation states.

Compared to the thermometer-coded attenuator 10 of FIG. 2 (e.g., with 32 stages 1 dB steps to yield a range of 0 dB to 32 dB), the example binary-weighted arrangement of FIG. 4 (e.g., with 5 stages (16 dB, 8 dB, 4 dB, 2 dB and 1 dB) to yield a range of 0 dB to 31 dB) provides a similar attenuation range using a much smaller number of stages. An example advantage of using such smaller number of stages includes a much smaller physical size of the attenuator device.

Despite the desirable smaller size, the foregoing binary-weighted arrangement can include glitches during various transitions. Further, sequencing of a given transition by two or more separate controlled operations does not solve such glitch effects.

Figure 5:
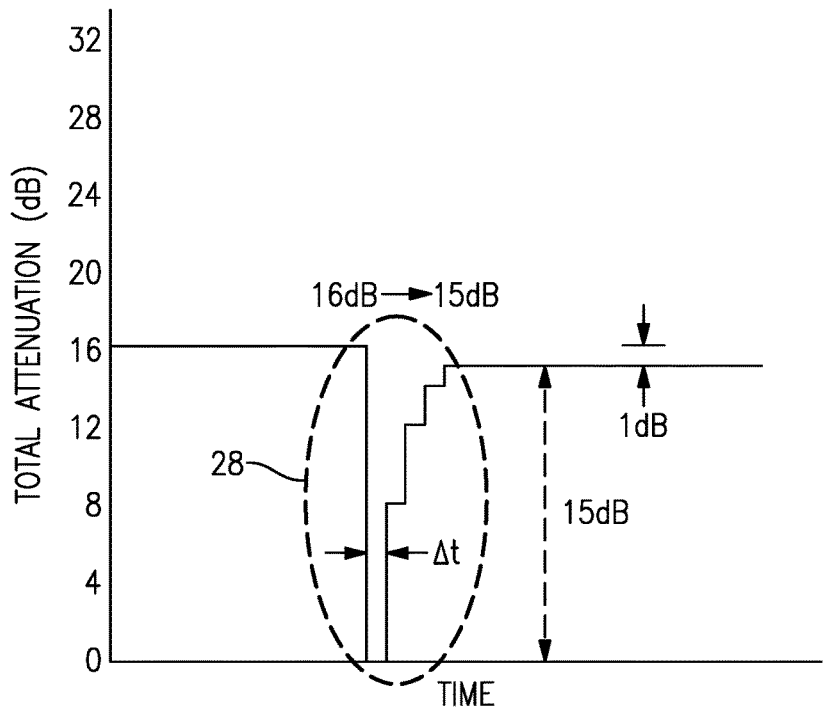
FIG. 5 shows an example attenuation transition that can be implemented in the binary-weighted attenuator of FIG. 4.

As generally understood, glitch effects associated with a binary-weighted arrangement results from use of different attenuation values during transitions that include both addition and subtraction operations. FIG. 5 shows an example attenuation transition that can be implemented in the example conventional attenuator 20 of FIG. 4. The example transition involves a decrease in attenuation from a start value of 16 dB to a stop value of 15 dB, for a change of 1 dB. At the start state, the 16 dB stage is in the RF path, and the rest of the stages (8 dB, 4 dB, 2 dB and 1 dB) are out of the RF path. To achieve the stop state of 15 dB, the 16 dB stage needs to be subtracted, and all of the 8 dB, 4 dB, 2 dB and 1 dB stages need to be added to the RF path.

The foregoing subtraction and addition operations involving the 5 stages (16 dB, 8 dB, 4 dB, 2 dB and 1 dB) are preferably performed substantially simultaneously, in which case there may not be a glitch. However, the independent control of the 5 stages can result in some or all of the subtraction and addition operations being performed at different times during the transition. In the example of FIG. 5, the 16 dB-to-15 dB transition is depicted as 28, and includes an initial subtraction of the 16 dB stage, followed by successive additions of the 8 dB, 4 dB, 2 dB and 1 dB stages. Between the subtraction of the 16 dB stage and the addition of the 8 dB stage, a time period of Δt can exist; and during such a time period, the overall attenuation falls to approximately zero. Such an effect can create an undesirable condition for a downstream circuit that should be receiving a signal reduced by 15 dB, but instead receives an un-attenuated signal.

In general, the maximum glitch for a given binary-weighted attenuation arrangement is the difference between the most significant bit (MSB) and the least significant bit (LSB). In the example shown in FIG. 4, the MSB is 16 dB, and the LSB is 1 dB; and thus, the 15 dB glitch shown for the 16 dB-to-15 dB transition in FIG. 5 is also the maximum glitch of 15 dB for the attenuator of FIG. 4.

It is also noted that for the example transition 28 of FIG. 5, there are other possible glitch values. For example, suppose that addition operations for the 8 dB and 4 dB stages occur before a subtraction of the 16 dB stage (and then followed by additions of the 2 dB and 1 dB stages). In such a combination, the additions of the 8 dB and 4 dB results in a first glitch of +12 dB above the start state of 16 dB, for a temporary overall attenuation of 28 dB. Then, the subtraction of the 16 dB stage results in the temporary overall attenuation falling to 12 dB which is a second glitch of −3 below the stop state of 15 dB. Accordingly, the largest glitch for such a combination of operations for the example transition 28 is +12 dB above the start state of 16 dB.

Figure 6:
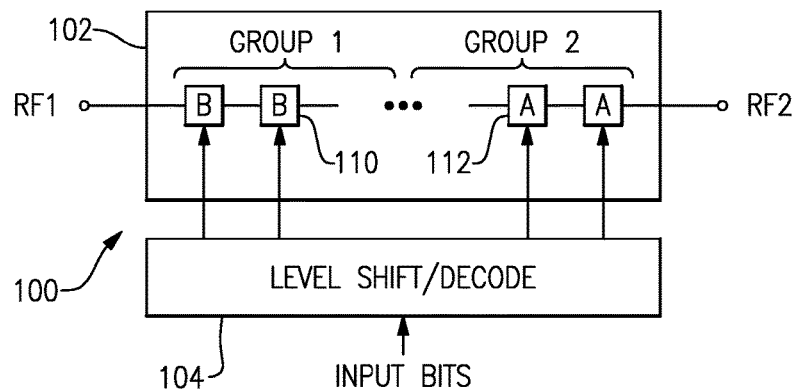
FIG. 6 shows an attenuator having one or more features as described herein.

FIG. 6 shows an attenuator 100 having an attenuator circuit 102 and a level shift/decode circuit 104. The attenuator circuit 102 is shown to include two groups of attenuation elements. The first group includes a plurality of attenuation elements 110, with each element configured to provide an attenuation of B-dB. The second group includes a plurality of attenuation elements 112, with each element configured to provide an attenuation of A-dB. Although described in the context of two groups of attenuation elements, it will be understood that more than two of such groups can be implemented.

In the example of FIG. 6, each attenuation element (110 or 112) (also referred to herein as a stage) can be controlled independently. Accordingly, such attenuation stages can be added or subtracted from an RF path between a first node RF1 and a second node RF2. When the first node RF1 functions as an input, the second node RF2 can function as an output. When operated in reverse, the second node RF2 can function as an input, and the first node RF1 can function as an output.

As described herein, the numbers of stages in each of the two groups in the attenuator 100 can be selected to, for example, yield a manageable number of stages overall, and to reduce the maximum glitch. As also described herein, the use of such groups of attenuation stages can further allow implementation of sequencing techniques that can eliminate glitches in most situations and reduce glitch effects in other situations. Various examples of the foregoing advantageous features are described herein in greater detail.

Figure 7:
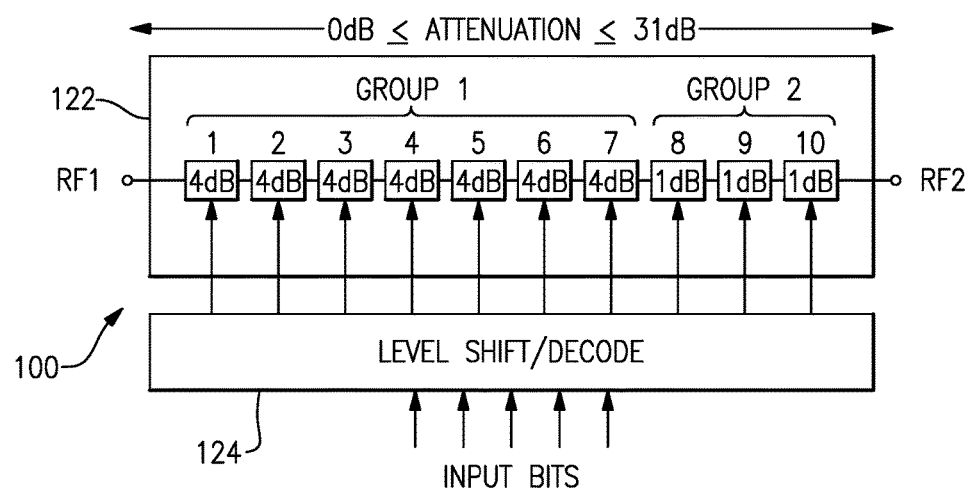
FIG. 7 shows an attenuator that can be a more specific example of the attenuator of FIG. 6.

FIG. 7 shows an attenuator 100 that can be a more specific example of the attenuator 100 of FIG. 6. In the example of FIG. 7, an attenuator circuit 122 is shown to include two groups of attenuation stages. The first group includes 7 attenuation stages, with each stage configured to provide an attenuation of 4 dB. The second group includes 3 attenuation stages, with each stage configured to provide an attenuation of 1 dB.

With the foregoing 10 attenuation stages, an overall attenuation of 0 dB to 31 dB can be obtained. To obtain such a range of attenuation values in 1 dB increments, a control word having 5 bits can be utilized. Table 1 lists states of the seven 4 dB stages and the three 1 dB stages for the 32 overall attenuation values. For a given stage, a "0" indicates that the stage is not in the RF path (e.g., bypassed), and a "1" indicates that the stage is in the RF path.

TABLE 1

| Overall Attenuation (dB) | 4 dB Stage | 4 dB Stage | 4 dB Stage | 4 dB Stage | 4 dB Stage | 4 dB Stage | 4 dB Stage | 1 dB Stage | 1 dB Stage | 1 dB Stage |
|---|---|---|---|---|---|---|---|---|---|---|
| 0 | 0 | 0 | 0 | 0 | 0 | 0 | 0 | 0 | 0 | 0 |
| 1 | 0 | 0 | 0 | 0 | 0 | 0 | 0 | 1 | 0 | 0 |
| 2 | 0 | 0 | 0 | 0 | 0 | 0 | 0 | 1 | 1 | 0 |
| 3 | 0 | 0 | 0 | 0 | 0 | 0 | 0 | 1 | 1 | 1 |
| 4 | 1 | 0 | 0 | 0 | 0 | 0 | 1 | 0 | 0 | 0 |
| 5 | 1 | 0 | 0 | 0 | 0 | 0 | 0 | 1 | 0 | 0 |
| 6 | 1 | 0 | 0 | 0 | 0 | 0 | 0 | 1 | 1 | 0 |
| 7 | 1 | 0 | 0 | 0 | 0 | 0 | 0 | 1 | 1 | 1 |

TABLE 1-continued

| Overall Attenuation (dB) | 4 dB Stage | 4 dB Stage | 4 dB Stage | 4 dB Stage | 4 dB Stage | 4 dB Stage | 4 dB Stage | 1 dB Stage | 1 dB Stage | 1 dB Stage |
|---|---|---|---|---|---|---|---|---|---|---|
| 8  | 1 | 1 | 0 | 0 | 0 | 0 | 0 | 0 | 0 | 0 |
| 9  | 1 | 1 | 0 | 0 | 0 | 0 | 0 | 1 | 0 | 0 |
| 10 | 1 | 1 | 0 | 0 | 0 | 0 | 0 | 1 | 1 | 0 |
| 11 | 1 | 1 | 0 | 0 | 0 | 0 | 0 | 1 | 1 | 1 |
| 12 | 1 | 1 | 1 | 0 | 0 | 0 | 0 | 0 | 0 | 0 |
| 13 | 1 | 1 | 1 | 0 | 0 | 0 | 0 | 1 | 0 | 0 |
| 14 | 1 | 1 | 1 | 0 | 0 | 0 | 0 | 1 | 1 | 0 |
| 15 | 1 | 1 | 1 | 0 | 0 | 0 | 0 | 1 | 1 | 1 |
| 16 | 1 | 1 | 1 | 1 | 0 | 0 | 0 | 0 | 0 | 0 |
| 17 | 1 | 1 | 1 | 1 | 0 | 0 | 0 | 1 | 0 | 0 |
| 18 | 1 | 1 | 1 | 1 | 0 | 0 | 0 | 1 | 1 | 0 |
| 19 | 1 | 1 | 1 | 1 | 0 | 0 | 0 | 1 | 1 | 1 |
| 20 | 1 | 1 | 1 | 1 | 1 | 0 | 0 | 0 | 0 | 0 |
| 21 | 1 | 1 | 1 | 1 | 1 | 0 | 0 | 1 | 0 | 0 |
| 22 | 1 | 1 | 1 | 1 | 1 | 0 | 0 | 1 | 1 | 0 |
| 23 | 1 | 1 | 1 | 1 | 1 | 0 | 0 | 1 | 1 | 1 |
| 24 | 1 | 1 | 1 | 1 | 1 | 1 | 0 | 0 | 0 | 0 |
| 25 | 1 | 1 | 1 | 1 | 1 | 1 | 0 | 1 | 0 | 0 |
| 26 | 1 | 1 | 1 | 1 | 1 | 1 | 0 | 1 | 1 | 0 |
| 27 | 1 | 1 | 1 | 1 | 1 | 1 | 0 | 1 | 1 | 1 |
| 28 | 1 | 1 | 1 | 1 | 1 | 1 | 1 | 0 | 0 | 0 |
| 29 | 1 | 1 | 1 | 1 | 1 | 1 | 1 | 1 | 0 | 0 |
| 30 | 1 | 1 | 1 | 1 | 1 | 1 | 1 | 1 | 1 | 0 |
| 31 | 1 | 1 | 1 | 1 | 1 | 1 | 1 | 1 | 1 | 1 |

Figure 8:
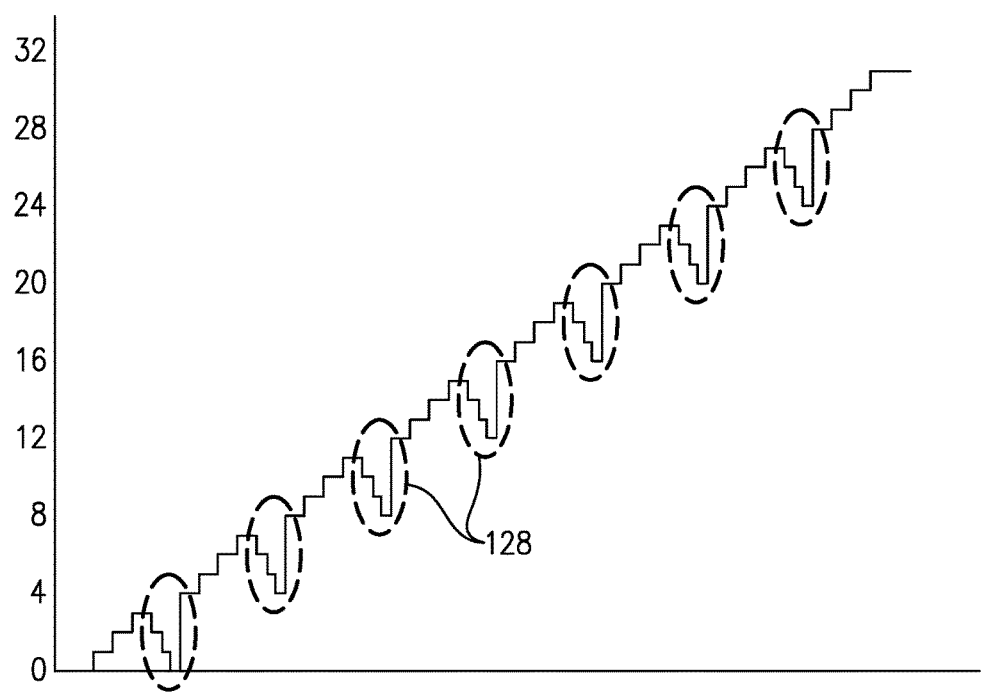
FIG. 8 shows an example sequence of successive 1 dB transitions that can be implemented in the attenuator of FIG. 7.

FIG. 8 shows a sequence of successive 1 dB transitions, starting from 0 dB to the maximum attenuation value of 31 dB. As shown in FIG. 8 and Table 1, when the 1 dB stages are added for the 1 dB transitions, glitches do not occur. However, when all three of the 1 dB stages are already in the RF path, they need to be subtracted and an available 4 dB stage needs to be added. For such transitions, the maximum glitch is 3 dB (depicted as 128 in FIG. 8).

In reference to FIG. 8, it will be understood that although the 3 dB glitch transitions 128 are depicted as a particular pattern of operations (e.g., successive subtraction of three 1 dB stages followed by an addition of one 4 dB stage), other patterns of operations are also possible; and some of such other patterns of operations can yield smaller glitches. It will also be understood that although FIG. 8 only shows successive 1 dB transitions, other transitions involving larger attenuation changes can also be implemented.

Figure 9A:
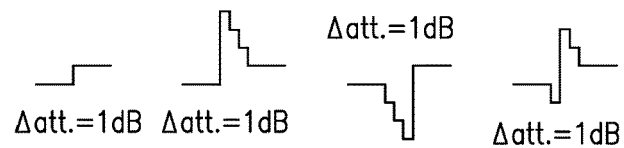
FIGS. 9A-9C show examples of attenuation changes (Δatt.) having different patterns of operations, and how such different patterns of operations can result in different glitches.
Figure 9B:
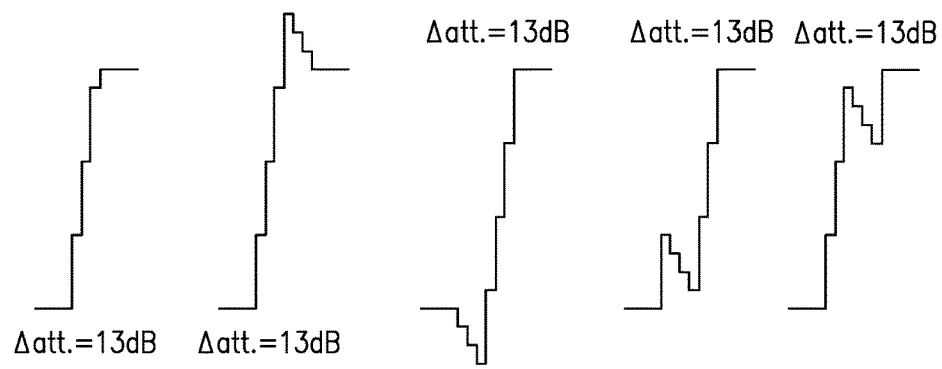
Figure 9C:
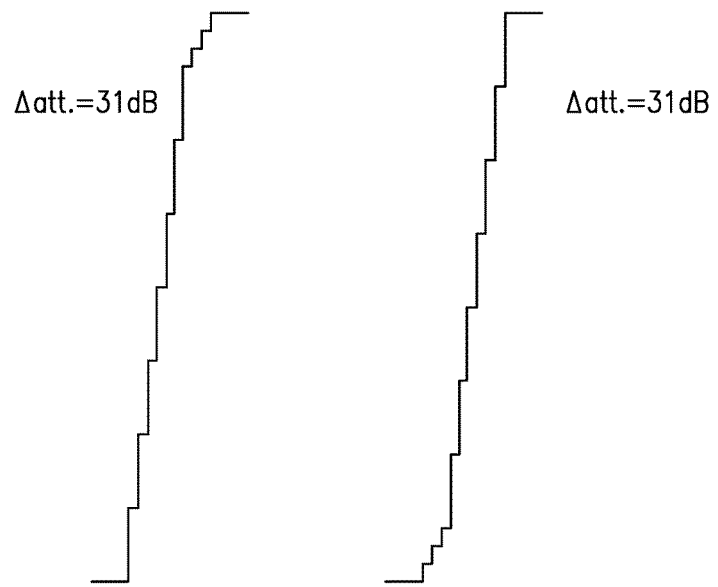

FIGS. 9A-9C show examples of attenuation changes (Δatt.) having different patterns of operations, and how such different patterns of operations can result in different glitches. FIG. 9A shows some patterns of operation(s) that can occur when a transition of a 1 dB increase (Δatt.=+1 dB) is desired. In the left-most example, an addition of a 1 dB stage can provide the desired +1 dB transition without a glitch. In the next example, the desired +1 dB transition is shown to result in an addition of a 4 dB stage followed by successive subtractions of three 1 dB stages, thereby yielding a glitch of 3 dB above the stop attenuation value. The next example is similar to the example transition 128 of FIG. 8, where successive subtractions of three 1 dB stages are followed by an addition of a 4 dB stage, thereby yielding a glitch of 3 dB below the start attenuation value. In the last example, the desired +1 dB transition is shown to result in subtraction of a 1 dB stage, followed by an addition of a 4 dB stage, followed by successive subtractions of two 1 dB stages, thereby yielding a glitch of 1 dB below the start attenuation value, and a larger glitch of 2 dB above the stop attenuation value.

FIG. 9B shows some patterns of operations that can occur when a transition of a 13 dB increase (Δatt.=+13 dB) is desired. In the left-most example, successive additions of three 4 dB stages and a 1 dB stage can provide the desired +13 dB transition without a glitch. In the next example, the same desired +13 dB transition is shown to result in a pattern where four 4 dB stages are added successively, followed by successive subtractions of three 1 dB stages, thereby yielding a glitch of 3 dB above the stop attenuation value. In the next example, the same desired +13 dB transition is shown to result in a pattern where three 1 dB stages are subtracted successively, followed by successive additions of four 4 dB stages, thereby yielding a glitch of 3 dB below the start attenuation value. In the next example, the same desired +13 dB transition is shown to result in a pattern where one 4 dB stage is added, followed by successive subtraction of three 1 dB stages, followed by successive addition of three 4 dB stages, thereby yielding a glitch-free transition. The last example is a variation of such a glitch-free transition involving both addition and subtraction operations. In the last example, successive additions of three 4 dB stages are followed by successive subtractions of three 1 dB stages, followed by an addition of one 4 dB stage, thereby yielding a glitch-free transition.

FIG. 9C shows some patterns of operations that can occur when a transition of a 31 dB increase (Δatt.=+31 dB) is desired. In the left example, successive additions of seven 4 dB stages and three 1 dB stages can provide the desired +31 dB transition without a glitch. In the right example, successive additions of three 1 dB stages and seven 4 dB stages can provide the desired +31 dB transition, again without a glitch.

Table 2 lists worst-case and best-case patterns for transitions involving the listed changes in attenuation (Δatt.). In Table 2, an addition of a negative number indicates a subtraction of the corresponding stage. Similar table can be formed for transitions involving reductions in attenuation.

TABLE 2

| Δatt. (dB) | Worst case | | | Best case | | |
|---|---|---|---|---|---|---|
| | Number of 4 dB stage(s) added | Number of 1 dB stage(s) added | Worst glitch size (dB) | Number of 4 dB stage(s) added | Number of 1 dB stage(s) added | Worst glitch size (dB) |
| 1  | 1 | −3 | 3 | 0 | 1 | 0 |
| 2  | 1 | −2 | 2 | 0 | 2 | 0 |
| 3  | 1 | −1 | 1 | 0 | 3 | 0 |
| 4  | 1 | 0  | 0 | 1 | 0 | 0 |
| 5  | 2 | −3 | 3 | 1 | 1 | 0 |
| 6  | 2 | −2 | 2 | 1 | 2 | 0 |
| 7  | 2 | −1 | 1 | 1 | 3 | 0 |
| 8  | 2 | 0  | 0 | 2 | 0 | 0 |
| 9  | 3 | −3 | 3 | 2 | 1 | 0 |
| 10 | 3 | −2 | 2 | 2 | 2 | 0 |
| 11 | 3 | −1 | 1 | 2 | 3 | 0 |
| 12 | 3 | 0  | 0 | 3 | 0 | 0 |
| 13 | 4 | −3 | 3 | 3 | 1 | 0 |
| 14 | 4 | −2 | 2 | 3 | 2 | 0 |
| 15 | 4 | −1 | 1 | 3 | 3 | 0 |
| 16 | 4 | 0  | 0 | 4 | 0 | 0 |
| 17 | 5 | −3 | 3 | 4 | 1 | 0 |
| 18 | 5 | −2 | 2 | 4 | 2 | 0 |
| 19 | 5 | −1 | 1 | 4 | 3 | 0 |
| 20 | 5 | 0  | 0 | 5 | 0 | 0 |
| 21 | 6 | −3 | 3 | 5 | 1 | 0 |
| 22 | 6 | −2 | 2 | 5 | 2 | 0 |
| 23 | 6 | −1 | 1 | 5 | 3 | 0 |
| 24 | 6 | 0  | 0 | 6 | 0 | 0 |
| 25 | 7 | −3 | 3 | 6 | 1 | 0 |
| 26 | 7 | −2 | 2 | 6 | 2 | 0 |
| 27 | 7 | −1 | 1 | 6 | 3 | 0 |
| 28 | 7 | 0  | 0 | 7 | 0 | 0 |
| 29 | — | —  | — | 7 | 1 | 0 |
| 30 | — | —  | — | 7 | 2 | 0 |
| 31 | — | —  | — | 7 | 3 | 0 |

One can note that the best-case for a given transition is where all of the operations are either additions or subtractions—that is, the operations are monotonic. It is also noted that for certain transitions, monotonic operations are the only possible operations, such that there is no distinction between worst-case and best-case. For example, transitions involving multiples of 4 dB essentially require monotonic operations with the 4 dB stages. For other transitions involving operations with both 4 dB and 1 dB stages, and as described in reference to FIGS. 9A-9C and Table 2, there can be a glitch-free result, a worst-case glitch result, or some glitch result in between. Overall, and assuming randomness or approximate randomness of operations in a given transition, about a third of transitions include glitches of various sizes.

One can also note that the example attenuator described herein in reference to FIGS. 7-9 and Tables 1 and 2 can provide advantageous features such as a reduced-glitch feature, as well as a reduced number of stages. For example, when compared to the binary-weighted attenuator having similar operating range and step size (e.g., attenuator 20 of FIG. 4), the attenuator 100 of FIG. 7 has a lower likelihood of glitches. Further, the attenuator 100 of FIG. 7 has a maximum glitch size of 3 dB, compared to the 15 dB maximum glitch for the binary-weighted attenuator 20 of FIG. 4.

In another example, 32 attenuation states (0 to 31 dB in 1 dB steps) can be obtained with the 10 stages (seven 4 dB and three 1 dB), compared to the thermometer-coded attenuator 10 of FIG. 2 which would require 31 1 dB steps to achieve the same operating range (0 to 31 dB) and step size (1 dB).

As described herein, the foregoing advantageous features associated with the examples of FIGS. 6-9 can be obtained without any sequencing operations. As also described herein, there are some transitions that can suffer from glitches, where certain patterns of operation can reduce the magnitudes of or eliminate such glitches. For example, FIG. 9B involves a 13 dB transition which can suffer from a glitch as large as 3 dB (second and third patterns from the left). However, the fourth and fifth example patterns involve both additions and subtractions; and yet both examples yield zero glitches.

In some implementations, an attenuator such as the example attenuator 100 of FIGS. 6 and 7 can be operated with sequenced commands to remove or reduce glitches in selected attenuation transitions. For the purpose of description herein, it will be understood that sequencing, sequenced, sequenced commands, sequenced operations, and the like can include more than one commands issued to effectuate a given attenuation transition. In the various transition examples described herein in reference to FIGS. 3, 5, 8 and 9 (e.g., 128 in FIG. 8 or any of the examples in FIGS. 9A-9C), it is assumed that a single command is provided to a level shift/decode circuit which in turn sends out independent add and/or subtract signals to the corresponding stages.

In an example sequenced configuration, a level shift/decode circuit can receive two or more commands so that independent add and/or subtract signals corresponding to each command are sent to the corresponding stages as a group separately from independent add and/or subtract signals of other group(s). Other sequenced configurations utilizing one or more features of the present disclosure can also be implemented.

FIGS. 10 and 11 show examples of sequenced operations that can be implemented for certain transitions. In FIG. 10A, an example of a 13 dB transition is a non-sequenced transition having a pattern 130 of operations that can result from a single control command. Such a transition is also described herein in reference to FIG. 9B (fourth example from the left). FIG. 10B shows an example of how sequencing can be implemented to ensure that glitch will not occur during a similar transition. In the example of FIG. 10B, a sequence of operations can include three separate commands, with the commands resulting in successive patterns indicated as 140, 142 and 144. The first command can result in the first pattern of operation 140 where one 4 dB stage is added; and since such an addition is towards the stop attenuation state, no glitch occurs. The second command can result in the second pattern of operation 142 where three 1 dB stages are subtracted. Even though the second pattern of operation 142 includes subtractions, no glitch occurs because of the presence of the previously added 4 dB stage (in the first pattern of operation 140). In some situations, the 4 dB stage added in the first pattern of operation 140 can be considered to be a buffer against a total of subtractions needed (e.g., 3 dB) for the transition. The third command can result in the third pattern of operation 144 where three 4 dB stages are added; and since such additions are toward the stop attenuation state, no glitch occurs.

Figure 11A:
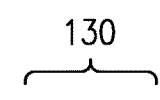
FIG. 11A shows another example of a non-sequenced 13 dB transition having a pattern of operations that can result from a single control command.
Figure 11A:
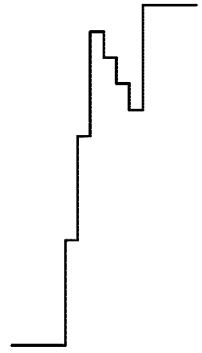
Figure 11B:
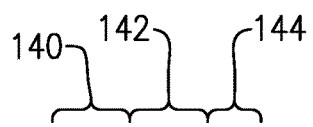
FIG. 11B shows another example of how sequencing can be implemented to ensure that glitch will not occur during an attenuation transition similar to the example of FIG. 11A.
Figure 11B:
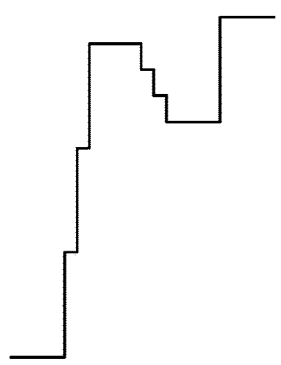

In FIG. 11A, another example of a 13 dB transition is a non-sequenced transition having a pattern 130 of operations that can result from a single control command. Such a transition is also described herein in reference to FIG. 9B (last example from the left). FIG. 11B shows another example of how sequencing can be implemented to ensure that glitch will not occur during a similar transition. In the example of FIG. 11B, a sequence of operations can include three separate commands, with the commands resulting in successive patterns indicated as 140, 142 and 144. The first command can result in the first pattern of operation 140 where three 4 dB stages are added; and since such additions are toward the stop attenuation state, no glitch occurs. The second command can result in the second pattern of operation 142 where three 1 dB stages are subtracted. Even though the second pattern of operation 142 includes subtractions, no glitch occurs because of the presence of the three previously added 4 dB stages (in the first pattern of operation 140). In some situations, the three 4 dB stages added in the first pattern of operation 140 can be considered to be a buffer against a total of subtractions needed (e.g., 3 dB) for the transition. The third command can result in the third pattern of operation 144 where one 4 dB stage is added; and since such an addition is towards the stop attenuation state, no glitch occurs.

Figure 10A:
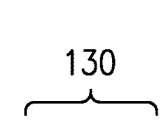
FIG. 10A shows an example of a non-sequenced 13 dB transition having a pattern of operations that can result from a single control command.
Figure 10A:
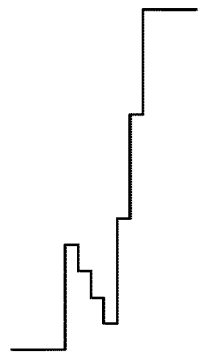
Figure 10B:
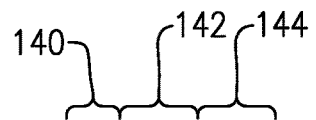
FIG. 10B shows an example of how sequencing can be implemented to ensure that glitch will not occur during an attenuation transition similar to the example of FIG. 10A.
Figure 10B:
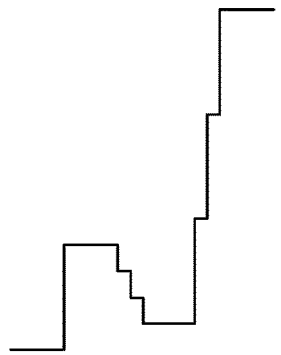

As described in the foregoing examples of FIGS. 10B and 11B, a first command can be configured to yield a pattern of operation towards the stop attenuation state (e.g., addition in FIGS. 10B and 11B), with sufficient magnitude to prevent glitches from any subsequent operation(s) away from the stop attenuation state (e.g., subtraction in FIGS. 10B and 11B). In more general terms, a first pattern of operation for a given transition can be configured to move attenuation towards the stop attenuation state with sufficient magnitude to accommodate some or all of subsequent operations toward the start attenuation state. A last pattern of operation for the same transition can also be configured to move attenuation towards the stop attenuation state. With such boundaries in place, one or more commands that result in corresponding intermediate pattern(s) of operation can be implemented without causing a glitch. In the examples of FIGS. 10B and 11B, there is only one intermediate pattern of operation (pattern 142), and such a pattern is shown to include all of the away-from-stop attenuation state operations (e.g., subtractions).

Table 2 lists the worst-case and best-case patterns for transitions involving the listed changes in attenuation (Δatt.), without the sequencing techniques as described herein. Table 3 lists the same worst-case and best-case patterns for transitions involving the listed changes in attenuation (Δatt.), with the sequencing techniques as described herein. In Table 3, an addition of a negative number indicates a subtraction of the corresponding stage. Similar table can be formed for transitions involving reductions in attenuation.

TABLE 3

| Δatt. (dB) | Worst case | | | Best case | | |
|---|---|---|---|---|---|---|
| | Number of 4 dB stage(s) added | Number of 1 dB stage(s) added | Worst glitch size (dB) | Number of 4 dB stage(s) added | Number of 1 dB stage(s) added | Worst glitch size (dB) |
| 1 | 1 | −3 | 3 | 0 | 1 | 0 |
| 2 | 1 | −2 | 2 | 0 | 2 | 0 |
| 3 | 1 | −1 | 1 | 0 | 3 | 0 |
| 4 | 1 | 0 | 0 | 1 | 0 | 0 |
| 5 | 2 | −3 | 0 | 1 | 1 | 0 |
| 6 | 2 | −2 | 0 | 1 | 2 | 0 |
| 7 | 2 | −1 | 0 | 1 | 3 | 0 |
| 8 | 2 | 0 | 0 | 2 | 0 | 0 |
| 9 | 3 | −3 | 0 | 2 | 1 | 0 |
| 10 | 3 | −2 | 0 | 2 | 2 | 0 |
| 11 | 3 | −1 | 0 | 2 | 3 | 0 |
| 12 | 3 | 0 | 0 | 3 | 0 | 0 |
| 13 | 4 | −3 | 0 | 3 | 1 | 0 |
| 14 | 4 | −2 | 0 | 3 | 2 | 0 |
| 15 | 4 | −1 | 0 | 3 | 3 | 0 |
| 16 | 4 | 0 | 0 | 4 | 0 | 0 |
| 17 | 5 | −3 | 0 | 4 | 1 | 0 |
| 18 | 5 | −2 | 0 | 4 | 2 | 0 |
| 19 | 5 | −1 | 0 | 4 | 3 | 0 |
| 20 | 5 | 0 | 0 | 5 | 0 | 0 |
| 21 | 6 | −3 | 0 | 5 | 1 | 0 |
| 22 | 6 | −2 | 0 | 5 | 2 | 0 |

TABLE 3-continued

| | Worst case | | | Best case | | |
|---|---|---|---|---|---|---|
| Δatt. (dB) | Number of 4 dB stage(s) added | Number of 1 dB stage(s) added | Worst glitch size (dB) | Number of 4 dB stage(s) added | Number of 1 dB stage(s) added | Worst glitch size (dB) |
| 23 | 6 | −1 | 0 | 5 | 3 | 0 |
| 24 | 6 | 0 | 0 | 6 | 0 | 0 |
| 25 | 7 | −3 | 0 | 6 | 1 | 0 |
| 26 | 7 | −2 | 0 | 6 | 2 | 0 |
| 27 | 7 | −1 | 0 | 6 | 3 | 0 |
| 28 | 7 | 0 | 0 | 7 | 0 | 0 |
| 29 | — | — | — | 7 | 1 | 0 |
| 30 | — | — | — | 7 | 2 | 0 |
| 31 | — | — | — | 7 | 3 | 0 |

One can see in Table 3 that the sequencing techniques described herein in reference to FIGS. 10 and 11 can eliminate glitches in almost all of the possible transitions. However, there are certain types of transitions involving Δatt. of 3 dB or less where introduction of a 4 dB stage can result in a glitch. It is also noted that sequencing can increase the overall switching time associated with a given sequenced transition. In the context of the 3-part sequence examples of FIGS. 10B and 11B, the overall switching time can be about triple the switching time associated with a non-sequenced transition.

In the various examples described in reference to FIGS. 7-11, the seven 4 dB stage and the three 1 dB stages can provide an attenuation range of 0 dB to 31 dB in 1 dB steps. It will be understood that other combinations of attenuation stage values can also be implemented. For example, if one desires a similar attenuation range but with smaller steps, seven 4 dB stages and seven 0.5 dB stages can be implemented; and such a combination can yield an attenuation range of 0 dB to 31.5 dB in 0.5 dB steps.

Figure 12:
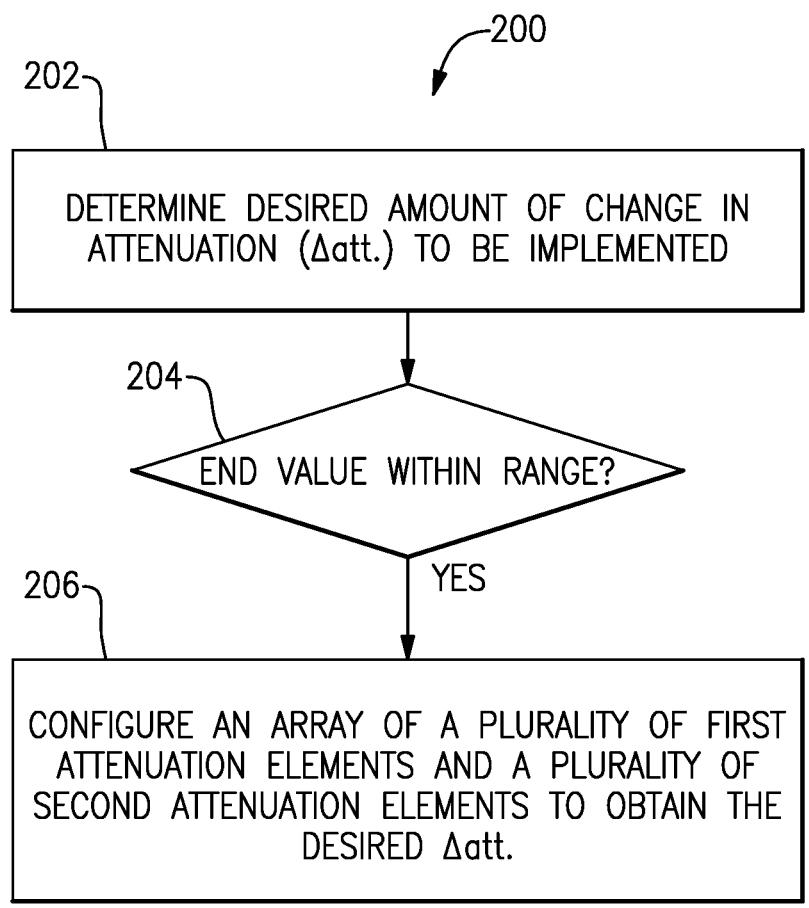
FIG. 12 shows a process that can be implemented to operate an attenuator having one or more features as described herein.

FIG. 12 shows a process 200 that can be implemented to operate an attenuator having one or more features as described herein. In block 202, a desired amount of change in attenuation (Δatt.) to be implemented can be determined. In a decision block 204, the process 200 can determine whether such a change can be implemented. For example, the process 200 can determine whether the end value resulting from the change is within an operating range of the attenuator. If the answer is "Yes," the process 200 in block 206 can configure an array of a plurality of first attenuation elements (also referred to herein as stages or steps) and a plurality of second attenuation elements, such that the array yields the desired Δatt. In some implementations, configuring of the array in block 206 may or may not include a sequencing technique.

Figure 13:
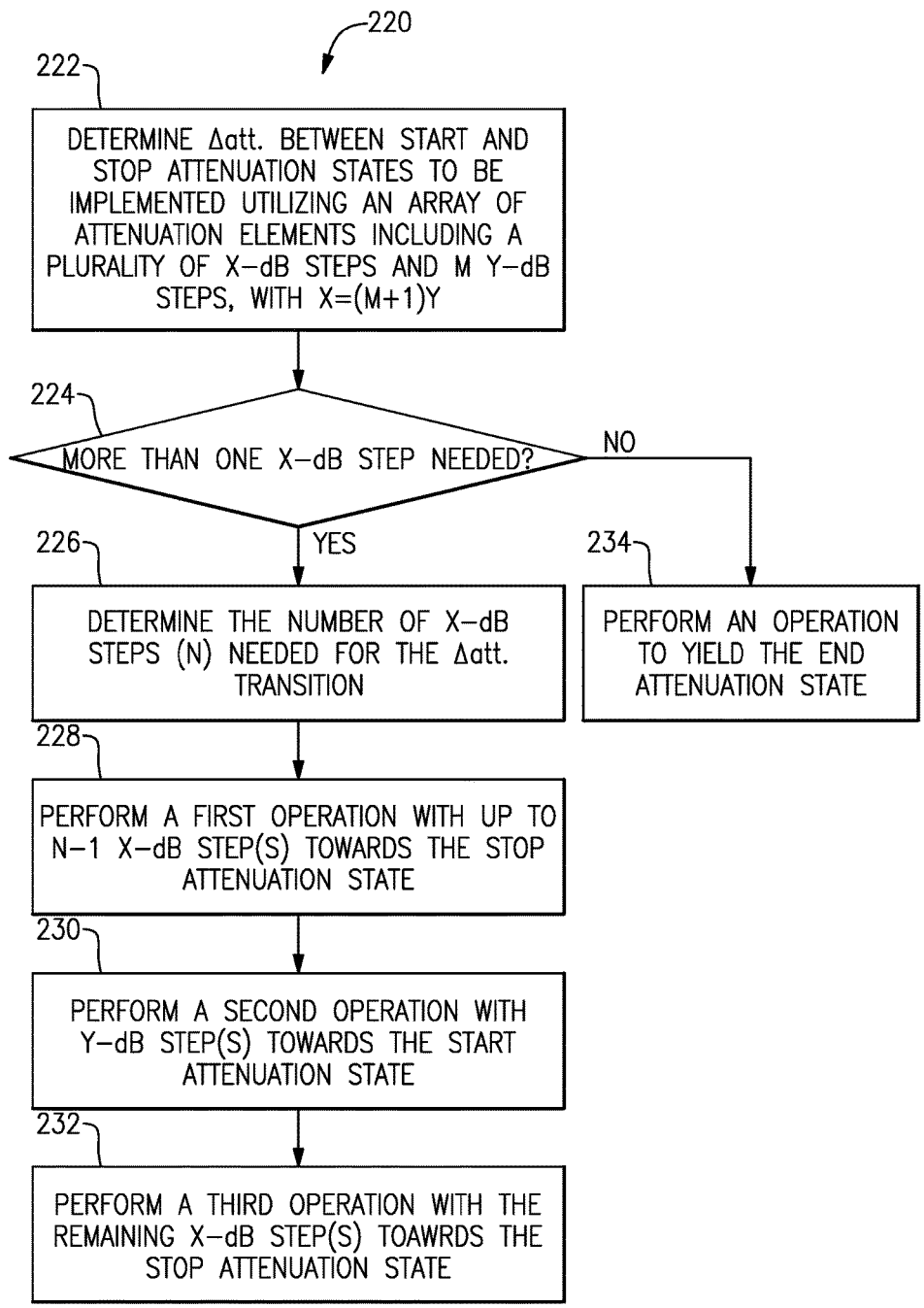
FIG. 13 shows a process that can be implemented to operate an attenuator using a sequencing technique.

FIG. 13 shows a process 220 that can be implemented to operate an attenuator using a sequencing technique. In block 222, Δatt. between start and stop attenuation states can be determined, where such Δatt. is to be implemented utilizing an array of attenuation elements including a plurality of X-dB stages and M Y-dB stages, with X=(M+1)Y. In a decision block 224, the process 220 can determine whether more than one X-dB stage is needed to implement the desired Δatt. If the answer is "Yes," the process 200 in block 226 can determine the number of X-dB stages (N) needed for the Δatt. transition. In block 228, a first operation can be performed with up to N−1 X-dB stage(s) towards the stop attenuation state. In block 230, a second operation can be performed with Y-dB stage(s) towards the start attenuation state. In block 232, a third operation can be performed with the remaining X-dB stage(s) towards the stop attenuation state.

Figure 14:
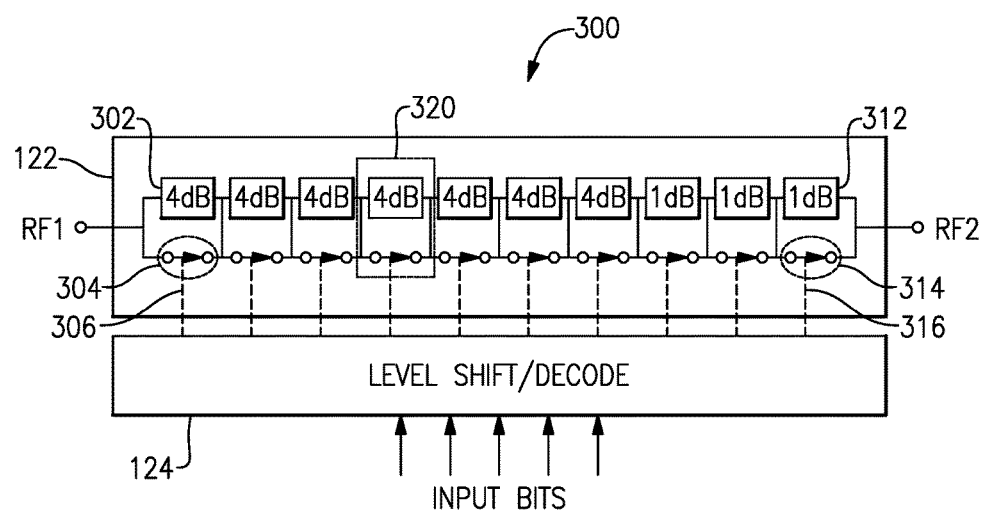
FIG. 14 shows an example of how various attenuation stages can be added to or subtracted from an RF path.

FIG. 14 shows an example of how various attenuation stages can be added to or subtracted from an RF path. An example attenuator 300 is similar to the example of FIG. 7, in that seven 4 dB stages (302) and three 1 dB stages (312) are implemented between a first node RF1 and a second node RF2. As shown, each stage can be a switchable stage 320 that includes a parallel arrangement of an attenuation element (4 dB or 1 dB) and a corresponding switch (304 or 314). Such parallel arrangements can be connected in series so as to yield a switchable array capable of providing 0 dB to 31 dB attenuation between RF1 and RF2.

Each switch (304 or 314) is shown to be controllable independently through its respective control line from a level shift/decode circuit 124. For example, a line 306 is shown to control the switch 304 associated with one of the 4 dB elements. Similarly, a line 316 is shown to control the switch 314 associated with one of the 1 dB elements. Accordingly, turning a given switch ON results in the corresponding attenuation element being bypassed, thereby subtracting that attenuation element from the RF path. Similarly, turning the switch OFF results in the attenuation element being inserted (added) into the RF path.

Figure 15A:
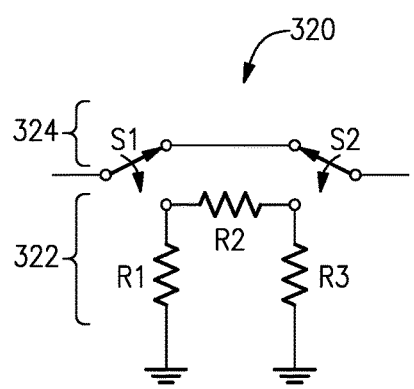
FIGS. 15A and 15B show examples of how each switchable attenuation stage of FIG. 14 can be implemented.
Figure 15B:
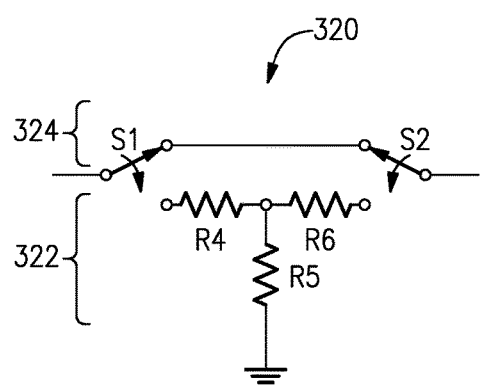

FIGS. 15A and 15B show examples of how each switchable attenuation stage 320 of FIG. 14 can be implemented. FIG. 15A shows that in some embodiments, a switchable attenuation stage 320 can include a switch portion 324 coupled to a resistor array 322. When both switches S1 and S2 are connected to the upper throws, an RF signal bypasses the resistor array 322. When both switches S1 and S2 are connected to the lower throws, the RF signal passes through the resistor array 322. In the example of FIG. 15A, the resistor array 322 is a π-type resistor network; and such a network can be configured to provide, for example accurate attenuation and desired impedance matching.

FIG. 15B shows that in some embodiments, a switchable attenuation stage 320 can include a switch portion 324 coupled to a resistor array 322. When both switches S1 and S2 are connected to the upper throws, an RF signal bypasses the resistor array 322. When both switches S1 and S2 are connected to the lower throws, the RF signal passes through the resistor array 322. In the example of FIG. 15B, the resistor array 322 is a T-type resistor network; and such a network can be configured to provide, for example accurate attenuation and desired impedance matching.

It will be understood that other types of resistor network or resistance configurations can be utilized to provide switched attenuation functionality for a given stage.

In some embodiments, the resistors in the resistor-arrays of FIGS. 15A and 15B can be implemented as thin-film resistive layers. Such thin-film resistive layers can be implemented on the same semiconductor substrate on which the switches (e.g., S1, S2) are fabricated. Such a semiconductor substrate can include, for example, gallium arsenide (GaAs).

Figure 16:
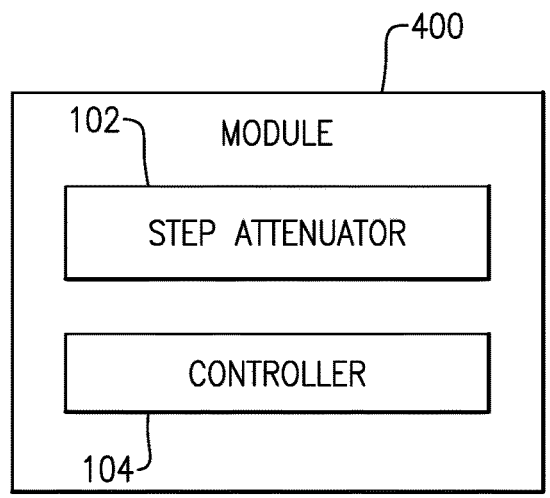
FIG. 16 shows that in some embodiments, an attenuator having one or more features as described herein can be implemented in an RF module.

FIG. 16 shows that in some embodiments, an attenuator having one or more features as described herein can be implemented in an RF module 400. As shown, such a module can include a step attenuator circuit 102 as described herein. The module 400 can further include a controller 104 having one or more features as described herein.

Figure 17:
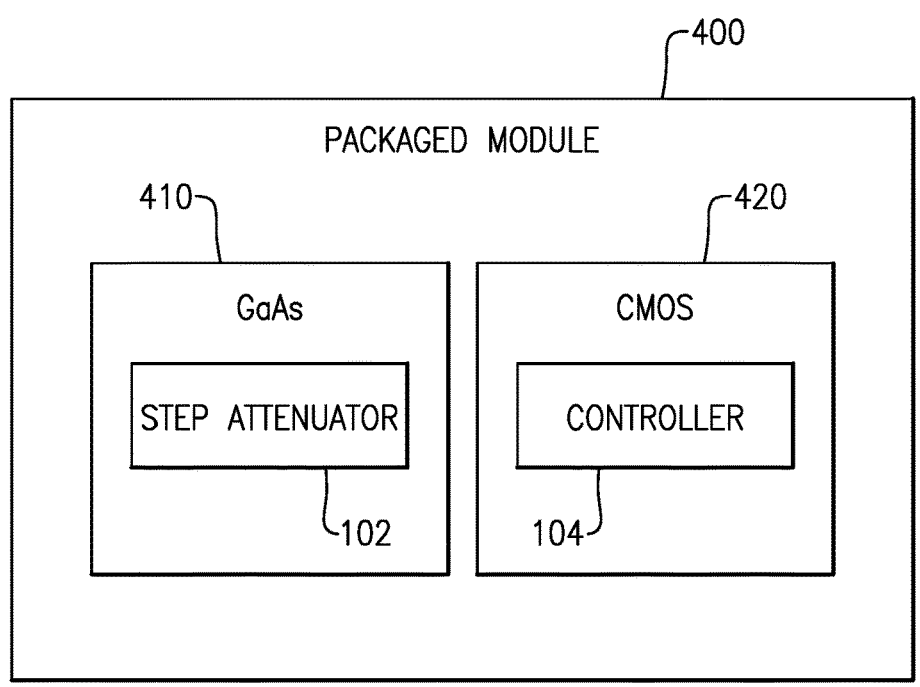
FIG. 17 shows that in some embodiments, the module of FIG. 16 can be implemented as a packaged module.

FIG. 17 shows that in some embodiments, the module of FIG. 16 can be implemented as a packaged module 400. In the example of FIG. 17, the step attenuator circuit 102 is depicted as being implemented on a GaAs die 410, and the controller 104 is depicted as being implemented on a CMOS die 420. Other configurations can also be implemented. For example, both of the step attenuator circuit 102 and the controller 104 can be implemented on a single CMOS die. In another example, both of the step attenuator circuit 102 and the controller 104 can be implemented on a single CMOS-silicon-on-insulator (CMOS-SOI) die which can yield improved switching performance (e.g., CMOS switches with improved isolation).

Figure 18:
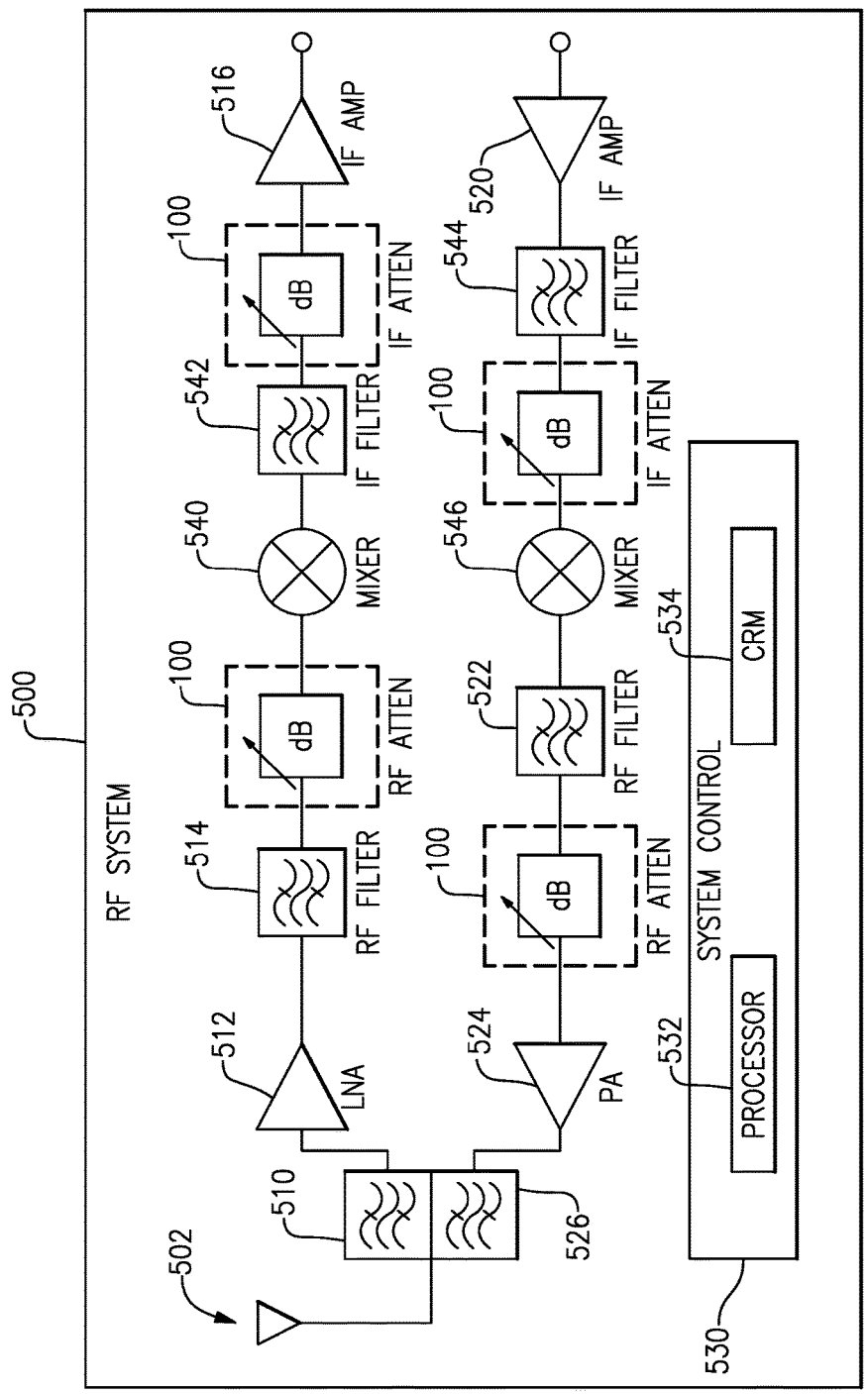
FIG. 18 shows non-limiting examples of how an attenuator having one or more features as described herein can be implemented in an RF system.

FIG. 18 shows non-limiting examples of how an attenuator having one or more features as described herein can be implemented in an RF system 500. Such an RF system can include an antenna 502 configured to facilitate reception and/or transmission of RF signals. In the context of reception, an RF signal received by the antenna 502 can be filtered (e.g., by a band-pass filter 510) before being amplified by a low-noise amplifier (LNA) 512. Such an LNA-amplified RF signal can be filtered (e.g., by a band-pass filter 514), passed through a step attenuator (RF ATTEN) 100, and routed to a mixer 540. The mixer 540 can operate with an oscillator (not shown) to yield an intermediate-frequency (IF) signal. Such an IF signal can be filtered (e.g., by a band-pass filter 542) and passed through a step attenuator (IF ATTEN) 100 before being routed to an intermediate-frequency (IF) amplifier 516. Either or both of the step attenuators (RF ATTEN and IF ATTEN) 100 along the receive path can include one or more features as described herein.

In the context of transmission, an IF signal can be provided to an IF amplifier 520. An output of the IF amplifier 520 can be filtered (e.g., by a band-pass filter 544) and passed through a step attenuator (IF ATTEN) 100 before being routed to a mixer 546. The mixer 546 can operate with an oscillator (not shown) to yield an RF signal. Such an RF signal can be filtered (e.g., by a band-pass filter 522) and passed through a step attenuator (RF ATTEN) 100 before being routed to a power amplifier (PA) 524. The PA-amplified RF signal can be routed to the antenna 502 through a filter (e.g., a band-pass filter 526) for transmission. Either or both of the step attenuators (IF ATTEN and RF ATTEN) 100 along the transmit path can include one or more features as described herein.

In some embodiments, various operations associated with the RF system 500 can be controlled and/or facilitated by a system controller 530. Such a system controller can include, for example, a processor 532 and a storage medium such as a non-transient computer-readable medium (CRM) 534. In some embodiments, at least some control functionalities associated with the operation of one or more step attenuators 100 in the RF system 500 can be performed by the system controller 530.

In some embodiments, the RF system 500 of FIG. 18 can be implemented as a base transceiver station configured for operation in various wireless bands, including cellular bands. It will also be understood that one or more features of the step attenuator 100 as described herein can also be implemented in portable wireless devices.

Various examples related to one or more features of the present disclosure are described herein in the context of step attenuation applications. It will be understood, however, that one or more features of the present disclosure can also be implemented in other RF applications, especially in applications where switching in and out of electrical elements in an array over a time period can result in intermediate states deviating outside of a desired range.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An attenuator comprising:
   a first group of attenuation steps each configured to switchably provide a first fixed attenuation value; and
   a second group of attenuation steps each configured to switchably provide a second fixed attenuation value less than the first fixed attenuation value, the attenuator capable of providing a total attenuation value from approximately zero to a sum of the attenuation steps of the first group and the second group in increments of the second fixed attenuation value, such that during a change in the total attenuation value, a glitch has a maximum magnitude that is a difference between the first fixed attenuation value and the second fixed attenuation value.

2. The attenuator of claim 1 wherein the attenuation steps of the first group and the second group are arranged in series between an input node and an output node of the attenuator.

3. The attenuator of claim 2 wherein the first group of attenuation steps are arranged in series with each other, and the second group of attenuation steps are arranged in series with each other.

4. The attenuator of claim 2 wherein the first group of attenuation steps includes N switchable attenuation steps capable of providing attenuation from approximately zero to N times the first fixed attenuation value, the quantity N being a positive integer.

5. The attenuator of claim 4 wherein the second group of attenuation steps includes M switchable attenuation steps capable of providing attenuation from approximately zero to M times the second fixed attenuation value, the quantity M being a positive integer.

6. The attenuator of claim 5 wherein the first and second attenuation fixed values are selected such that the first fixed attenuation value is approximately (M+1) times the second fixed attenuation value.

7. The attenuator of claim 2 wherein each of the attenuation steps of the first group and the second group includes a parallel arrangement of a resistive path and a bypass path, and a switching circuit configured to provide the corresponding fixed attenuation value by the resistive path or approximately zero attenuation by the bypass path in the attenuation step.

8. An packaged module comprising:
a packaging substrate configured to receive a plurality of components; and
an attenuation circuit implemented on the packaging substrate and having a first group of attenuation steps each configured to switchably provide a first fixed attenuation value, and a second group of attenuation steps each configured to switchably provide a second fixed attenuation value less than the first fixed attenuation value, the attenuation circuit capable of providing a total attenuation value from approximately zero to a sum of the attenuation steps of the first group and the second group in increments of the second fixed attenuation value, such that during a change in the total attenuation value, a glitch has a maximum magnitude that is a difference between the first fixed attenuation value and the second fixed attenuation value.

9. The packaged module of claim 8 further comprising a controller implemented on the packaging substrate and in communication with the attenuation circuit, the controller configured to control each of the attenuation steps of the first and second groups.

10. The packaged module of claim 9 wherein each of the attenuation steps of the first group and the second group includes a combination of a resistance circuit, a bypass path, and a switching circuit to provide the corresponding fixed attenuation value or approximately zero attenuation by the bypass path in the attenuation step.

11. The packaged module of claim 10 wherein the resistance circuit includes a π-type or T-type network of resistors.

12. The packaged module of claim 11 wherein at least some of the resistors are implemented as thin-film resistors.

13. The packaged module of claim 10 wherein the attenuation circuit is implemented on a first semiconductor die and the controller is implemented on a second semiconductor die.

14. The packaged module of claim 13 wherein the first semiconductor die includes a gallium arsenide die and the second semiconductor die includes a complementary metal-oxide-semiconductor die.

15. The packaged module of claim 9 further comprising a filter configured to filter a radio-frequency signal.

16. The packaged module of claim 9 further comprising a radio-frequency integrated circuit configured to process a radio-frequency signal.

17. The packaged module of claim 16 wherein the radio-frequency integrated circuit is configured to amplify a received radio-frequency signal.

18. A wireless device comprising:
an antenna configured to receive a signal;
a transceiver in communication with the antenna through a signal path and configured to process the received signal; and
an attenuator implemented along the signal path and including a first group of attenuation steps each configured to switchably provide a first fixed attenuation value, and a second group of attenuation steps each configured to switchably provide a second fixed attenuation value less than the first fixed attenuation value, the attenuator capable of providing a total attenuation value from approximately zero to a sum of the attenuation steps of the first group and the second group in increments of the second fixed attenuation value, such that during a change in the total attenuation value, a glitch has a maximum magnitude that is a difference between the first fixed attenuation value and the second fixed attenuation value.

19. The wireless device of claim 18 further comprising a low-noise amplifier implemented along the signal path and configured to amplify the received signal from the antenna.

20. The wireless device of claim 19 wherein the attenuator is implemented upstream or downstream of the low-noise amplifier along the signal path.

* * * * *